United States Patent
Zeevi et al.

(10) Patent No.: US 7,212,463 B2
(45) Date of Patent: May 1, 2007

(54) METHOD AND SYSTEM OF OPERATING MODE DETECTION

(75) Inventors: Josef Zeevi, Austin, TX (US); Antonio Torrini, Austin, TX (US)

(73) Assignee: Sigma Tel, Inc., Austin, TX (US)

( * ) Notice: Subject to any disclaimer, the term of this patent is extended or adjusted under 35 U.S.C. 154(b) by 48 days.

(21) Appl. No.: 11/233,999

(22) Filed: Sep. 23, 2005

(65) Prior Publication Data

US 2007/0070770 A1    Mar. 29, 2007

(51) Int. Cl.
*G11C 5/14* (2006.01)
(52) U.S. Cl. .................. 365/226; 365/200; 365/230.05
(58) Field of Classification Search ................ 365/226, 365/200, 189.05, 230.05, 241
See application file for complete search history.

(56) References Cited

U.S. PATENT DOCUMENTS 5,594,360 A *   1/1997  Wojciechowski ........... 324/771
5,663,918 A *   9/1997  Javanifard et al. .......... 365/226
6,512,401 B2    1/2003  Clark et al.
6,515,507 B1    2/2003  Patel et al.
2006/0285391 A1* 12/2006 Cernea .................. 365/185.22

* cited by examiner

*Primary Examiner*—Richard T. Elms
*Assistant Examiner*—Hien N Nguyen
(74) *Attorney, Agent, or Firm*—Toler Schaffer, LLP

(57) ABSTRACT

A system and method of providing a voltage to a non-volatile memory. The system includes an output pin to provide an output voltage to a non-volatile memory and includes a memory to store a table. The table includes a plurality of operating voltage levels. The system further includes a voltage mode module to apply a first voltage at a first of the plurality of operating voltage levels at the output pin prior to a read operation on the non-volatile memory. The voltage mode module applies a second voltage at a second of the plurality of voltage levels at the output pin in response to a read operation that returns a failure condition.

21 Claims, 3 Drawing Sheets

US 7,212,463 B2

METHOD AND SYSTEM OF OPERATING MODE DETECTION

FIELD OF THE DISCLOSURE

The present disclosure is generally related to non-volatile memory systems.

BACKGROUND

Consumer electronic devices, such as cellular telephones, digital music players, thumb drives and other handheld devices, execute increasingly complicated algorithms, such as algorithms for decoding compressed digital audio and video data and user interface algorithms. As the complexity of these algorithms increases, so does the memory usage for storing such algorithms.

Increasingly, manufacturers are turning to non-volatile memory devices, such as flash memory devices including NAND flash and NOR flash memory devices. Different non-volatile memory devices may operate at different power levels and use different instruction sets. In order to interface with any particular non-volatile memory, a microprocessor or other device may have to provide an output at the proper voltage level and may need to determine an appropriate instruction set for communicating with the particular non-volatile memory.

DESCRIPTION OF THE DRAWINGS

A system and method of providing a voltage to a non-volatile memory is disclosed. The system includes an output pin to provide an output voltage to a non-volatile memory and includes a memory to store a table. The table includes a plurality of operating voltage levels. The system further includes a voltage mode module to apply a first voltage at a first of the plurality of operating voltage levels at the output pin prior to a read operation on the non-volatile memory. The voltage mode module applies a second voltage at a second of the plurality of voltage levels at the output pin in response to a read operation that returns a failure condition.

The method includes providing a predetermined voltage at a first voltage level to a non-volatile memory prior to performing a first read operation on the non-volatile memory. The method further includes comparing a result of the first read operation to an expected result and providing a voltage at a second voltage level to the non-volatile memory.

Figure 1:
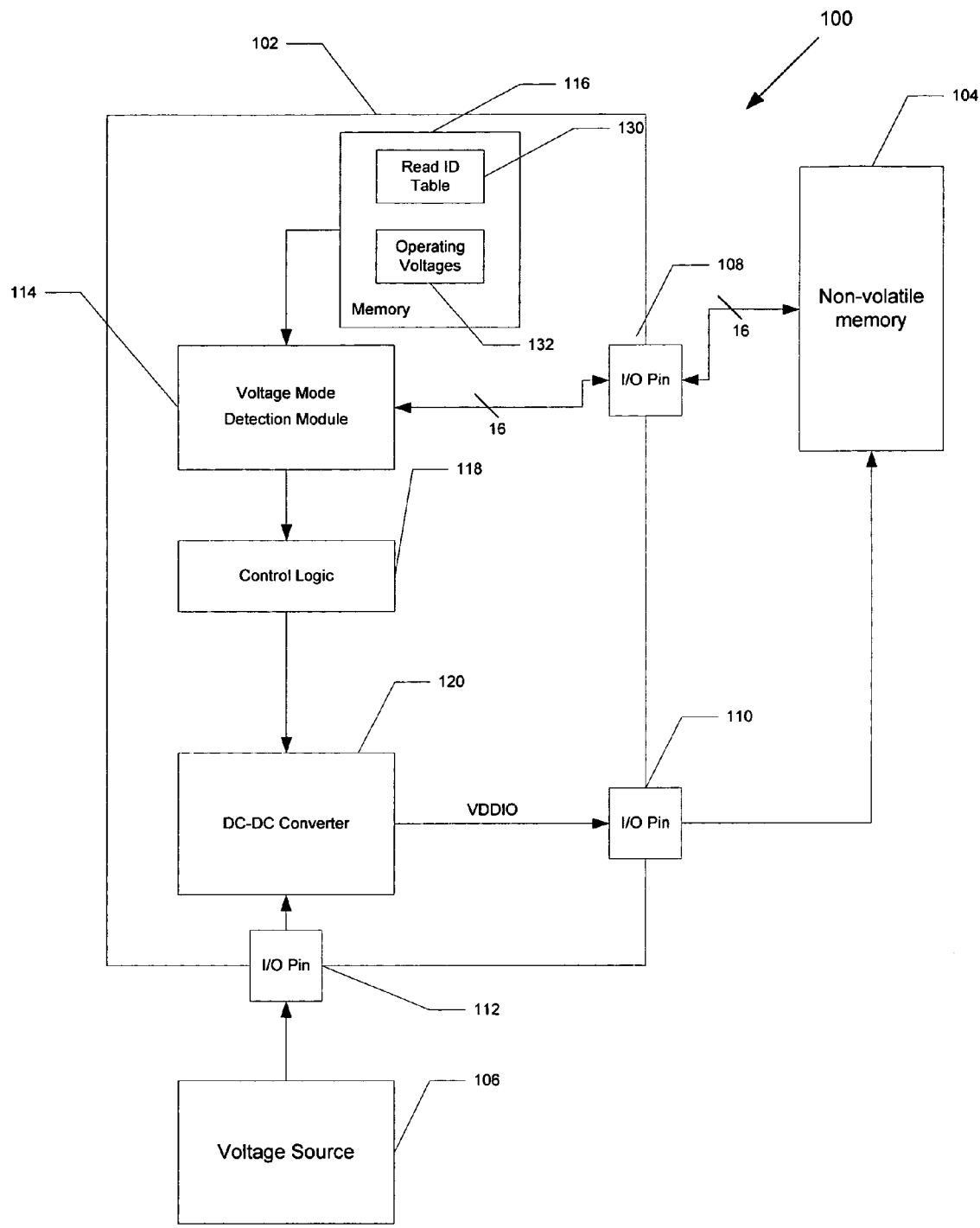
FIG. 1 is a block diagram of an exemplary embodiment of a system for communicating with a non-volatile memory.

Referring to FIG. 1, a system 100 for communicating with an external non-volatile memory is shown. The system 100 includes an integrated circuit 102, a non-volatile memory 104 and a voltage source 106. In a particular embodiment, the non-volatile memory is a flash memory device.

The integrated circuit 102 includes a first input/output pin 108, a second input/output pin 110, and a third input/output pin 112. The integrated circuit 102 also includes a memory 116, a voltage mode detection module 114, control logic 118, and a direct current (DC) to direct current (DC) converter 120. The non-volatile memory 104 is coupled to the integrated circuit 102 via the first input/output pin 108 and the second input/output pin 110. The voltage source 106 is connected to the integrated circuit 102 via the third input/output pin 112.

The memory 116 includes a read identification (read ID) table 130 and a plurality of operating voltages 132. The memory 116 is coupled to the voltage mode detection module 114. The voltage mode detection module 114 is connected to the input/output pin 108. The control logic 118 is responsive to the voltage mode detection module 114. The direct current to direct current converter 120 is responsive to the control logic 118. The direct current to direct current converter 120 is coupled to the second input/output pin 110 and the third input/output pin 112.

During operation, the integrated circuit 102 determines an operating voltage level for the non-volatile memory 104. The integrated circuit determines the operating voltage level by providing a series of voltages to the non-volatile memory 104. After each voltage is applied at the non-volatile memory 104, the integrated circuit 102 performs a read operation on the non-volatile memory. If the read operation is successful, the integrated circuit 102 stops providing new voltage levels to the non-volatile memory 104 and begins normal communications with the non-volatile memory 104. By using the existing read/write bus between the integrated circuit 102 and the non-volatile memory 104 to determine the operating voltage, the pin count for the integrated circuit 104. For example, certain prior art systems require a dedicated pin to determine an operating voltage for a non-volatile memory. The system reads a voltage or resistance or other value at the dedicated pin to determine an operating voltage for the non-volatile memory. The integrated circuit 102 may not require such a dedicated pin.

As illustrated, the integrated circuit 102 provides a voltage at a first voltage level to the non-volatile memory 104 via the second input/output pin 110. The voltage may be provided after a system startup or reset, but before a first read operation is performed. After the voltage is provided, the integrated circuit 102 performs a first read operation on the non-volatile memory 104. If the result of the first read operation is a failure condition, such as an error message, unexpected or unreadable data, or other indication of failure, the integrated circuit 102 provides a voltage at a second level to the non-volatile memory 104. The integrated circuit 102 then performs another read operation on the non-volatile memory 104, and checks again for a failure condition. The integrated circuit 102 continues changing the voltage level at the second input/output pin 110 and performing read operations on the non-volatile memory 104 until a read operation does not result in a failure condition. In this way, the integrated circuit 102 determines an operating voltage level that may be applied to the non-volatile memory 104 to perform a read operation.

To provide a voltage to the non-volatile memory 104, the integrated circuit 102 receives a voltage from the voltage source 106 via the third input/output pin 112. In a particular embodiment, the voltage source 106 is a battery. In another particular embodiment, the voltage source 106 is a voltage applied via a universal serial bus (USB) connection. The DC to DC converter 120 converts the voltage applied by the voltage source 106 to an output voltage labeled "VDDIO". The VDDIO voltage is provided to the non-volatile memory 104 via the second input/output pin 110.

The DC to DC converter 120 is capable of converting the voltage received from the voltage source 106 to several different voltage levels. The control logic 118 provides a control signal to the DC to DC converter 120 to control the desired level of the voltage VDDIO. The control logic 118 provides the control signal based on the output of the voltage mode detection module 114.

In addition, the voltage mode detection module 114 is capable of accessing the memory 116. In particular, the voltage mode detection module 114 may access the operating voltages 132 stored in the memory 116. The voltage mode detection module 114 may provide a signal to the control logic 118 to control the DC to DC converter 120 so that VDDIO is set to one of the voltages stored in the operating voltages 132. The voltage mode detection module 114 is also capable of performing a read operation on the non-volatile memory 104 via the first input/output pin 108.

To determine an operating voltage to be applied to the non-volatile memory 104, the voltage mode detection module can set VDDIO to a first operating voltage, where the first operating voltage is one of the operating voltages 132 stored in the memory 116. The first operating voltage may be a default voltage, and may be selected from a plurality of operating voltage levels associated with different non-volatile memory devices. In a particular embodiment, the first operating voltage is 1.8 volts. The voltage mode detection module 114 may perform a read operation on the external non-volatile memory 104. The voltage mode detection module 114 may compare the result of the first read operation to the entries in the read ID table 130 stored in the memory 116 to determine if the read operation resulted in a failure condition. A failure condition may result if the result of the first read operation is not found in the read ID table 130, if an error message is returned from the non-volatile memory 104, or if another failure condition is detected. If the result of the first read operation performed on the external non-volatile memory 104 is a failure condition, the voltage mode detection module 114 may instruct the control logic 118 to control the DC to DC converter 120 to set the voltage VDDIO to a second voltage level. The second voltage level may be retrieved from the operating voltages 132.

After the voltage VDDIO has been set to the second operating voltage level, the voltage mode detection module 114 may perform a second read operation. If the result of the second read operation also results in a failure condition (i.e. a successful read operation is performed), the voltage mode detection module 114 may apply a third operating voltage stored in the operating voltages 132. The voltage mode detection module 114 may continue to provide different operating voltages to the non-volatile memory 104 until a read operation does not result in a failure condition, indicating that an appropriate operating voltage for the non-volatile memory 104 has been identified.

The read ID table 116 may include a table of non-volatile memory devices. In a particular embodiment, the read ID table 116 includes multiple entries, and each entry in the table is associated with an expected result of a corresponding read operation. In addition, the read ID table 116 may include a list of selectable instruction sets for the non-volatile memory 104. Each of the selectable instruction set may be associated with a particular manufacturer of a non-volatile memory device. The read ID table 116 may store a list of these manufacturers and the associated instruction sets.

After the voltage mode detection module 114 has determined an operating voltage to be applied to the non-volatile memory 104, further read operations may be performed and the voltage mode detection module 114 may access the read ID table 116 based on these read operations to determine a selected instruction set for the non-volatile memory 104. In a particular embodiment, the non-volatile memory 104 can provide a manufacturer identification to the integrated circuit 102. By comparing the manufacturer identification with the read ID table 116, the integrated circuit 102 can determine a selected instruction set for the non-volatile memory 104. The integrated circuit 102 may then communicate with the non-volatile memory 104, including performing read, write, erase and other operations.

Figure 2:
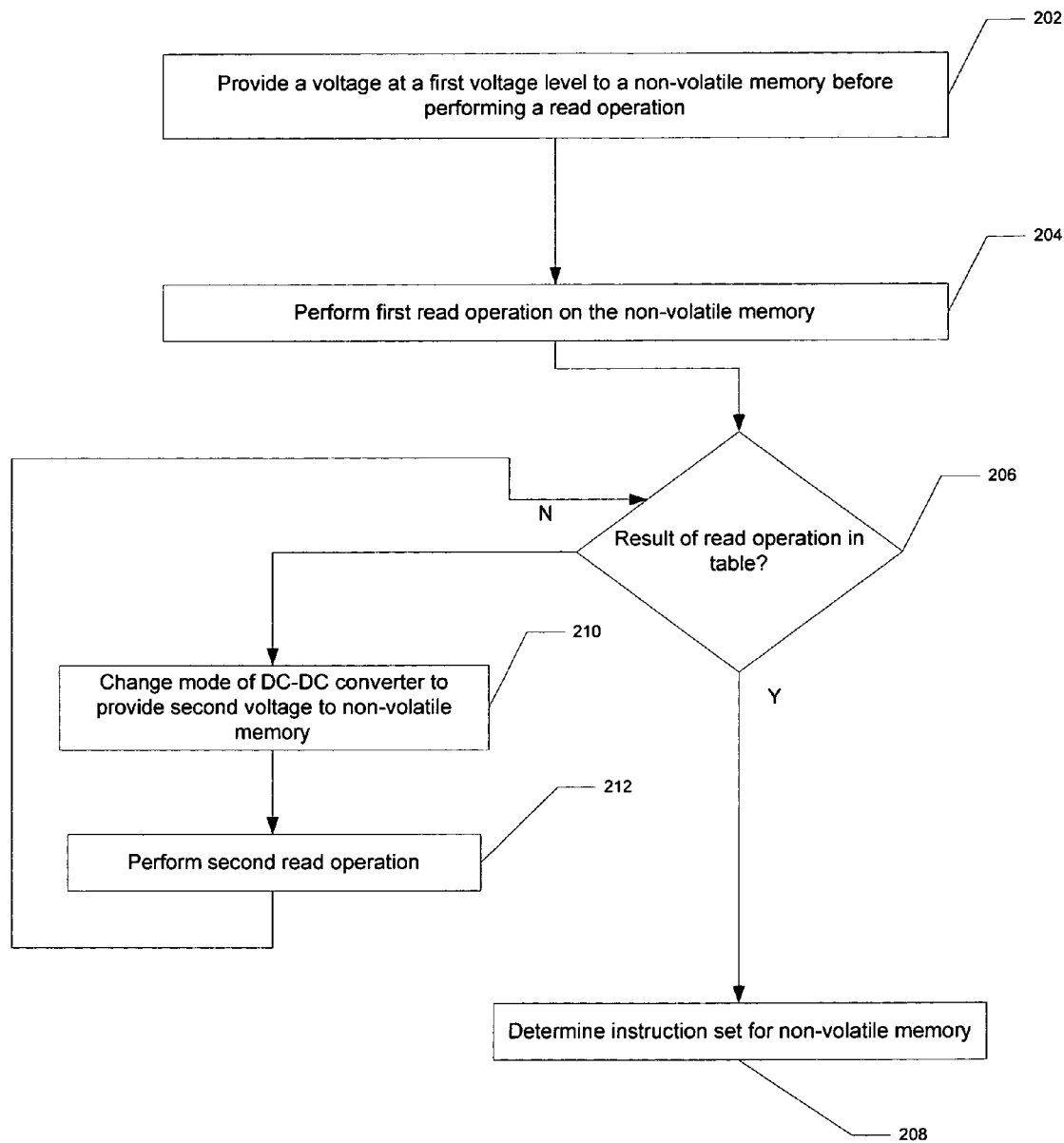
FIG. 2 is a flow chart of a method of determining an operating voltage to be applied to a non-volatile memory.

Referring to FIG. 2, a method of determining an operating voltage for a non-volatile memory is illustrated. In a particular embodiment, the non-volatile memory is a NAND flash memory. At step 202, a voltage is provided to the non-volatile memory at a first voltage level before a read operation is performed. The voltage may be provided in response to a system power up, a reset condition, or other appropriate circumstance. In a particular embodiment, the first voltage level is about 1.8 volts. In another particular embodiment, the first voltage level is based on a battery voltage level. The first voltage level may be a "default" voltage level associated with a type of non-volatile memory device.

Moving to step 204, a first read operation is performed on the non-volatile memory. In a particular embodiment, the first read operation may be an attempt to identify a manufacturer of the non-volatile memory.

Proceeding to decision step 206, it is determined whether the result of a first read operation is successful or if an error condition occurred by comparing a read result to expected data located in a table. The table may be stored in a memory of an integrated circuit, and may include a list of non-volatile memory manufacturers. If the expected result of the first read operation is found in the table the method moves to step 208 and an instruction set is determined for the non-volatile memory. The instruction set may be determined based on the manufacturer identified in the table by the associated read operation. If, at decision step 206, it is determined that the result of the first read operation is not located in the table the method moves to step 210. At step 210, a mode of a direct current to direct current converter is changed or other actions may be taken to provide a second voltage level to be applied to the non-volatile memory. In a particular embodiment, the second voltage level is about 3.3 volts. Proceeding to step 212, a second read operation is performed. The method then returns to step 206. Alternatively, if there are only two possible operating voltages for the non-volatile memory, the method may proceed to step 208.

Figure 3:
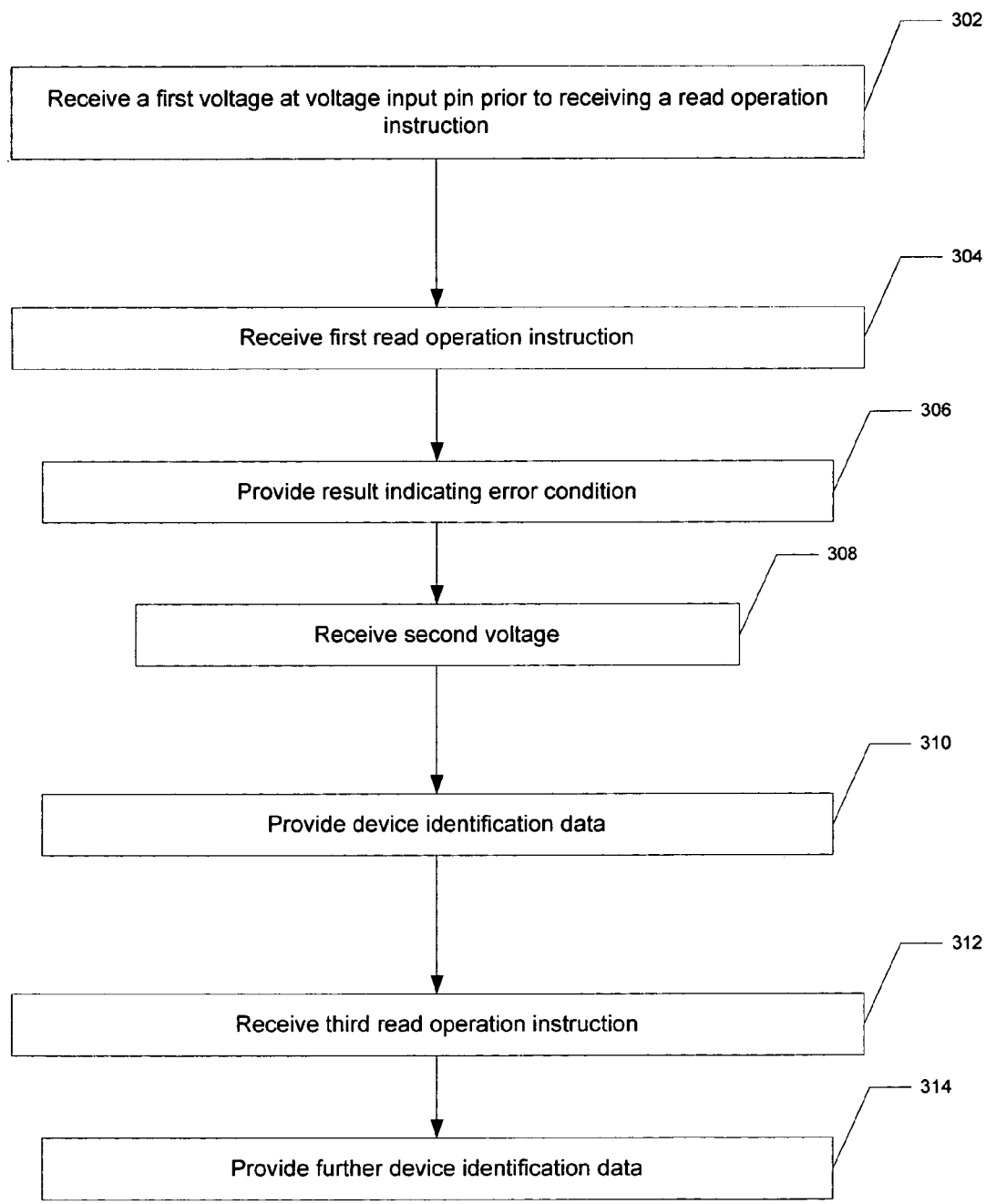
FIG. 3 is a flow chart of a method of receiving a voltage applied at a non-volatile memory is illustrated.

Referring to FIG. 3, a method of receiving an operating voltage at a non-volatile memory is illustrated. At step 302, a first voltage is received at an input pin of the non-volatile memory prior to receiving a first read operation request. The voltage input pin may provide a power or operating voltage for the non-volatile memory. In a particular embodiment, a first received voltage level has a voltage level of about 1.8 volts.

Proceeding to step 304, a first read operation is received by the non-volatile memory. The first read operation may be provided by a microprocessor or other appropriate device. Moving to step 306, a result of the data read operation is provided indicating a failure condition. The result may include an error message, unexpected or unreadable data, or other appropriate condition.

Moving to step 308, a second voltage is received at the power input pin. The second voltage is different from the first voltage. In a particular embodiment the second voltage level is about 3.3 volts. Moving to step 310, device identification data is provided by the non-volatile memory. The device identification data may identify a manufacturer of the non-volatile memory, an instruction set for the non-volatile memory, or other identification data. The device identification data may be provided in response to a read identification (READ ID) operation.

Proceeding to step 312, a third read operation instruction request is received. At step 314, further device identification data is provided by the non-volatile memory. The further device identification data may include data to identify a type of non-volatile memory, data regarding page size, block size, redundant area size, memory organization information, access time information or other appropriate information.

As will be appreciated by those skilled in the art, the disclosed system and method allow for determination of an operating voltage for a non-volatile memory without use of a dedicated operating voltage identification pin. This may allow for a reduced pin count in an integrated circuit. In addition, it will be appreciated that the disclosed system and method may be used to determine an operating voltage from among more that two possible operating voltage levels.

The above disclosed subject matter is to be considered illustrative, and not restrictive, and the appended claims are intended to cover all such modifications, enhancements, and other embodiments which fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An integrated circuit, comprising:
    an output pin to provide an output voltage to a non-volatile memory;
    a memory to store a table including a plurality of operating voltage levels; and
    a voltage mode module to apply a first voltage at a first of the plurality of operating voltage levels at the output pin prior to a first read operation on the non-volatile memory, wherein the voltage mode module applies a second voltage at a second of the plurality of voltage levels at the output pin in response to the first read operation returning a failure condition.

2. The integrated circuit of claim 1, further comprising:
    an input pin;
    a direct current to direct current converter to convert a voltage received at the input pin to an output voltage, wherein a voltage at the output pin is based on the output voltage.

3. The integrated circuit of claim 2, further comprising:
    control logic responsive to the voltage mode module to control a conversion mode of the direct current to direct current converter.

4. The integrated circuit of claim 1, wherein the voltage mode module applies a third voltage at a third of the plurality of voltage levels at the output pin in response to a second read operation on the non-volatile memory returning a failure condition.

5. The integrated circuit of claim 2, wherein the voltage received at the input pin is applied via a universal serial bus (USB) connection.

6. The integrated circuit of claim 1, wherein the memory includes a table of non-volatile memory devices.

7. The integrated circuit of claim 6, wherein the table of non-volatile memory devices includes a plurality of entries, each entry in the plurality of entries associated with an expected result of the read operation.

8. The integrated circuit of claim 1, wherein the integrated circuit does not include a dedicated non-volatile memory voltage detection pin.

9. A method, comprising:
    providing a predetermined voltage at a first voltage level to a non-volatile memory prior to performing a read operation;
    performing a first read operation on the non-volatile memory;
    comparing a result of the first read operation to an expected result; and
    providing a voltage at a second voltage level to the non-volatile memory.

10. The method of claim 9, further comprising:
    switching a conversion mode of a direct current to direct current converter after comparing the received data.

11. The method of claim 9, wherein the result of the first read operation is compared to a table.

12. The method of claim 9, wherein the first voltage level is about 1.8 volts and the second voltage level is about 3.3 volts.

13. The method of claim 9, wherein the non-volatile memory is a NAND flash memory.

14. The method of claim 9, wherein the first voltage level is based on a battery voltage level.

15. The method of claim 9, further comprising
    performing a second read operation on the non-volatile memory;
    determining a memory instruction set based on the result of the second read operation.

16. The method of claim 15, wherein the result of the second read operation is device identification data.

17. The method of claim 9, wherein the device identification data is associated with a manufacturer of the non-volatile memory.

18. A method of receiving a voltage at a non-volatile memory device, comprising
    receiving a first voltage from at a power input pin prior to receiving a read operation instruction;
    receiving a first read operation instruction;
    providing a result of the first read operation instruction indicating a failure condition; and
    receiving a second voltage at the power input pin, the second voltage different from the first voltage.

19. The method of claim 18, further comprising:
    receiving a second read operation instruction;
    providing device identification information.

20. The method of claim 19, further comprising:
    receiving a third read operation instruction;
    providing further device identification information.

21. The method of claim 18, wherein the first voltage is about 3.3 volts and the second voltage is about 1.8 volts.

* * * * *